(12) United States Patent
Zha et al.

(10) Patent No.: US 8,267,158 B2
(45) Date of Patent: Sep. 18, 2012

(54) THERMAL MODULE

(75) Inventors: Xin-Xiang Zha, Shenzhen (CN);
Shu-Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 522 days.

(21) Appl. No.: 12/488,525

(22) Filed: Jun. 20, 2009

(65) Prior Publication Data

US 2010/0096112 A1 Apr. 22, 2010

(30) Foreign Application Priority Data

Oct. 16, 2008 (CN) .......................... 2008 1 0304956

(51) Int. Cl.
*F28F 7/00* (2006.01)
*F28F 13/12* (2006.01)
*H05K 7/20* (2006.01)
*B64C 11/16* (2006.01)
*F04D 29/54* (2006.01)

(52) U.S. Cl. ....... 165/80.3; 165/122; 361/695; 416/238; 416/DIG. 2; 415/206

(58) Field of Classification Search ................ 165/80.3, 165/121, 122; 361/695, 697; 415/202, 206; 416/234, 238, 223 A, 223 R, 228, 235, DIG. 2
See application file for complete search history.

(56) References Cited

U.S. PATENT DOCUMENTS

| | | | |
|---|---|---|---|
| 2,422,615 A * | 6/1947 | Halford | 416/188 |
| 2,484,554 A * | 10/1949 | Concordia et al. | 416/188 |
| 3,124,200 A * | 3/1964 | Wilson | 416/93 R |
| 4,520,541 A * | 6/1985 | Miki et al. | 29/889.23 |
| 4,521,154 A * | 6/1985 | Corbett | 416/175 |
| 6,736,610 B2 * | 5/2004 | Cifarelli | 417/366 |
| 6,822,862 B2 * | 11/2004 | Rong-Yao | 361/695 |
| 7,556,087 B2 * | 7/2009 | Hung | 165/80.3 |
| 2005/0061477 A1 * | 3/2005 | Mira | 165/80.3 |
| 2006/0207748 A1 * | 9/2006 | Hashimoto et al. | 165/80.3 |
| 2007/0020103 A1 * | 1/2007 | Spaggiari | 416/223 R |
| 2008/0011461 A1 * | 1/2008 | Hwang et al. | 165/122 |
| 2008/0251237 A1 * | 10/2008 | Hung | 165/80.3 |

FOREIGN PATENT DOCUMENTS

JP 2007-146746 A 6/2007

* cited by examiner

*Primary Examiner* — Ljiljana (Lil) V. Ciric
*Assistant Examiner* — Jason Thompson
(74) *Attorney, Agent, or Firm* — Altis Law Group, Inc.

(57) ABSTRACT

A centrifugal fan includes a housing and an impeller rotatably received in the housing. The housing defines an air inlet in a top plate thereof and an air outlet in a sidewall thereof. The air inlet is perpendicular to the air outlet. The impeller includes a hub and a plurality of blades extending outwardly from a sidewall of the hub. Each of the blades includes an inner blade section connected with the sidewall of the hub and an outer blade section extending outwardly from the inner blade section. An upper portion of the inner blade section is curved upwardly and forwardly from a curved lower portion of the inner blade section towards an adjacent front blade. The curved lower portion has a curvature smaller than that of the upper portion.

4 Claims, 4 Drawing Sheets

THERMAL MODULE

BACKGROUND

1. Technical Field

The present disclosure relates to centrifugal fans, and particularly to an centrifugal fan with an improved impeller.

2. Description of Related Art

In a portable electronic device such as a notebook computer, a thermal module is generally required to dissipate heat generated by heat-generating electronic components such as CPU (central processing unit). The thermal module typically includes a centrifugal fan, a fin assembly mounted at an air outlet of the centrifugal fan, and a heat pipe thermally connecting the CPU with the fin assembly.

The centrifugal fan includes a housing and an impeller rotatably received in the housing. The impeller includes a hub and a plurality of plate-type blades extending radially from the hub. The blades extend linearly outwardly from the hub. However, the plate-type blades cannot generate a satisfactory air volume and air pressure, so that the efficiency of the centrifugal fan is affected accordingly.

Therefore, it is desired to provide a centrifugal fan having an improved impeller to overcome the above described shortcoming.

BRIEF DESCRIPTION OF THE DRAWINGS

Many aspects of the present disclosure can be better understood with references to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
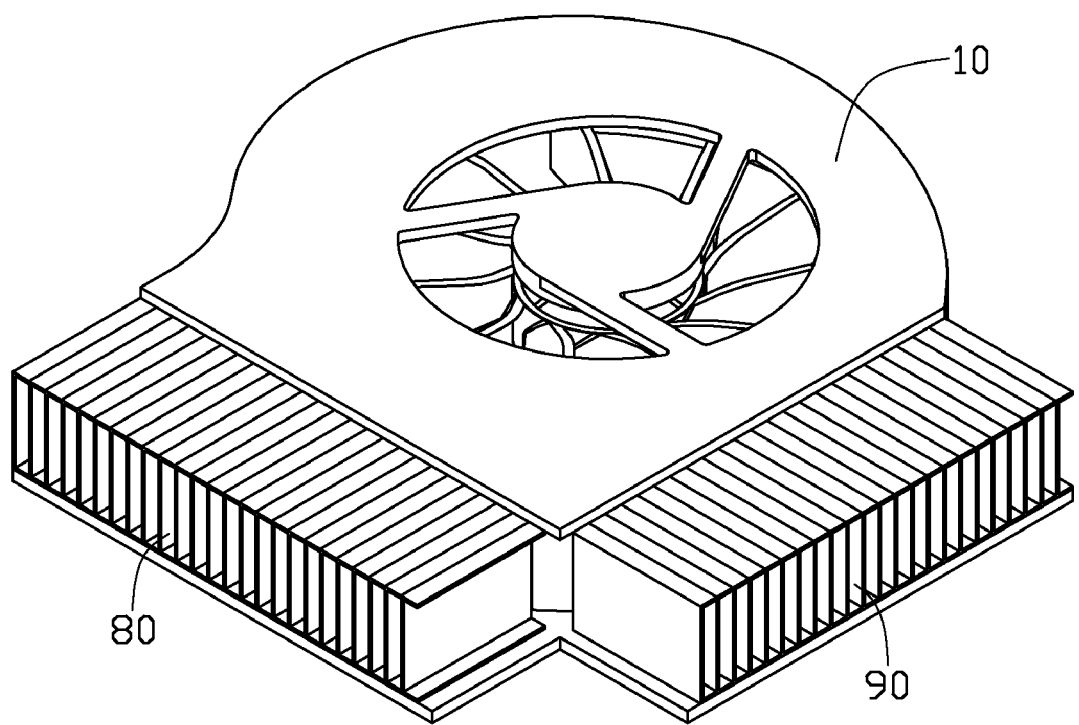
FIG. 1 is an assembled, isometric view of a thermal module in accordance with an exemplary embodiment of the present disclosure.
Figure 2:
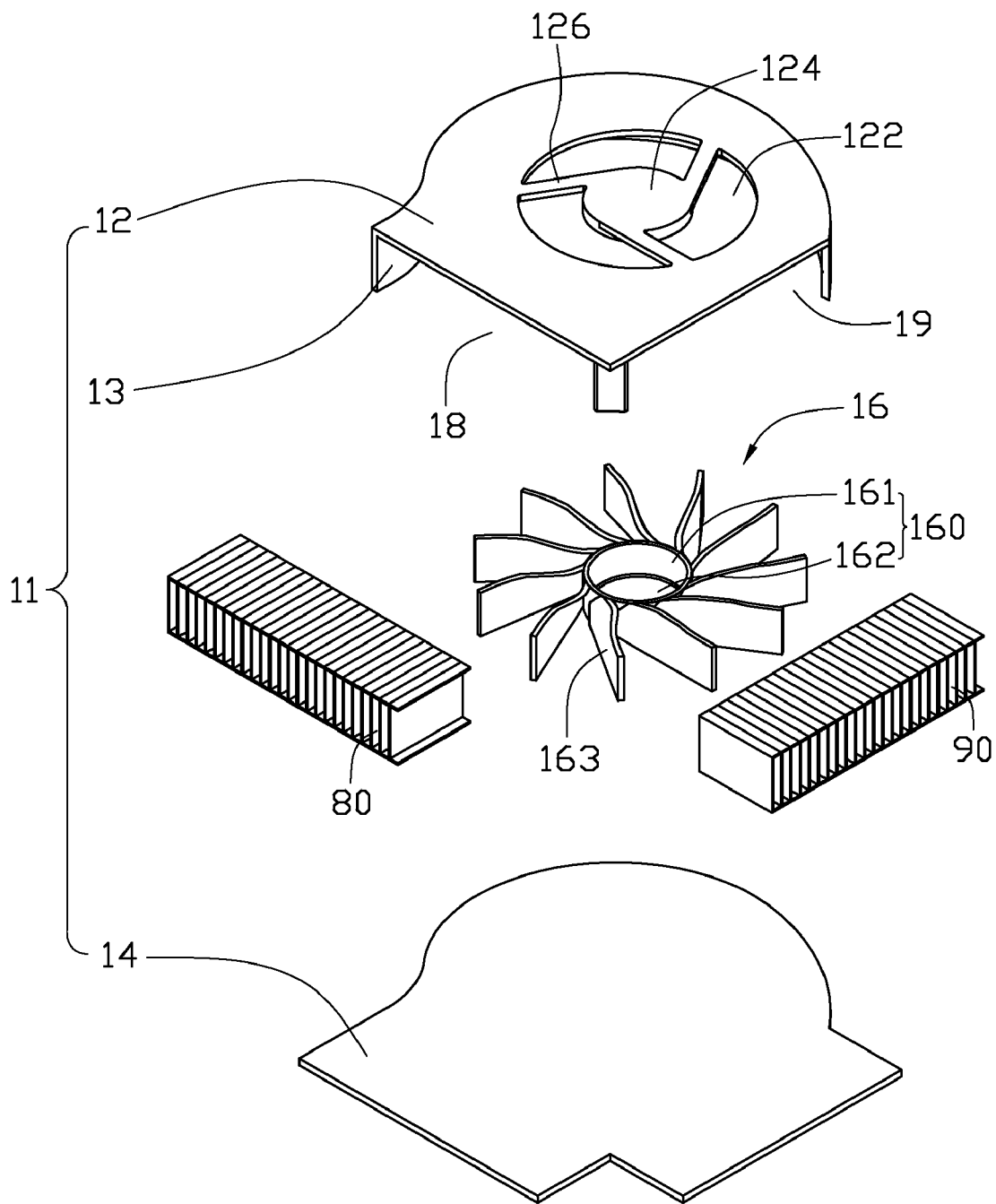
FIG. 2 is an exploded, isometric view of the thermal module of FIG. 1.

Referring to FIGS. 1 and 2, a thermal module according to an exemplary embodiment of the present disclosure is shown. The thermal module is typically suitable for using in a portable electronic device such as a notebook computer to dissipate heat of a heat-generating electronic component such as a CPU in the notebook computer. The thermal module includes a centrifugal fan 10, a first fin assembly 80, and a second fin assembly 90. The centrifugal fan 10 includes a housing 11 and an impeller 16 rotatably received in the housing 11. The housing 11 includes a top plate 12, a bottom plate 14, and a sidewall 13 connecting the top plate 12 with the bottom plate 14. The sidewall 13 extends downwardly from an outer periphery of the top wall 12 towards the bottom plate 14. An air inlet 122 is defined through a central portion of the top plate 12. A supporting base 124 is provided in the air inlet 122 for mounting the impeller 16 thereon. The supporting base 124 is connected with the top plate 12 via a plurality of ribs 126. A first air outlet 18 and a second air outlet 19 are defined in the sidewall 13 corresponding to the first fin assembly 80 and the second fin assembly 90, respectively. The air inlet 122 is perpendicular to the first air outlet 18 and the second air outlet 19. Furthermore, the first and second air outlets 18, 19 are oriented perpendicular to each other.

Figure 3:
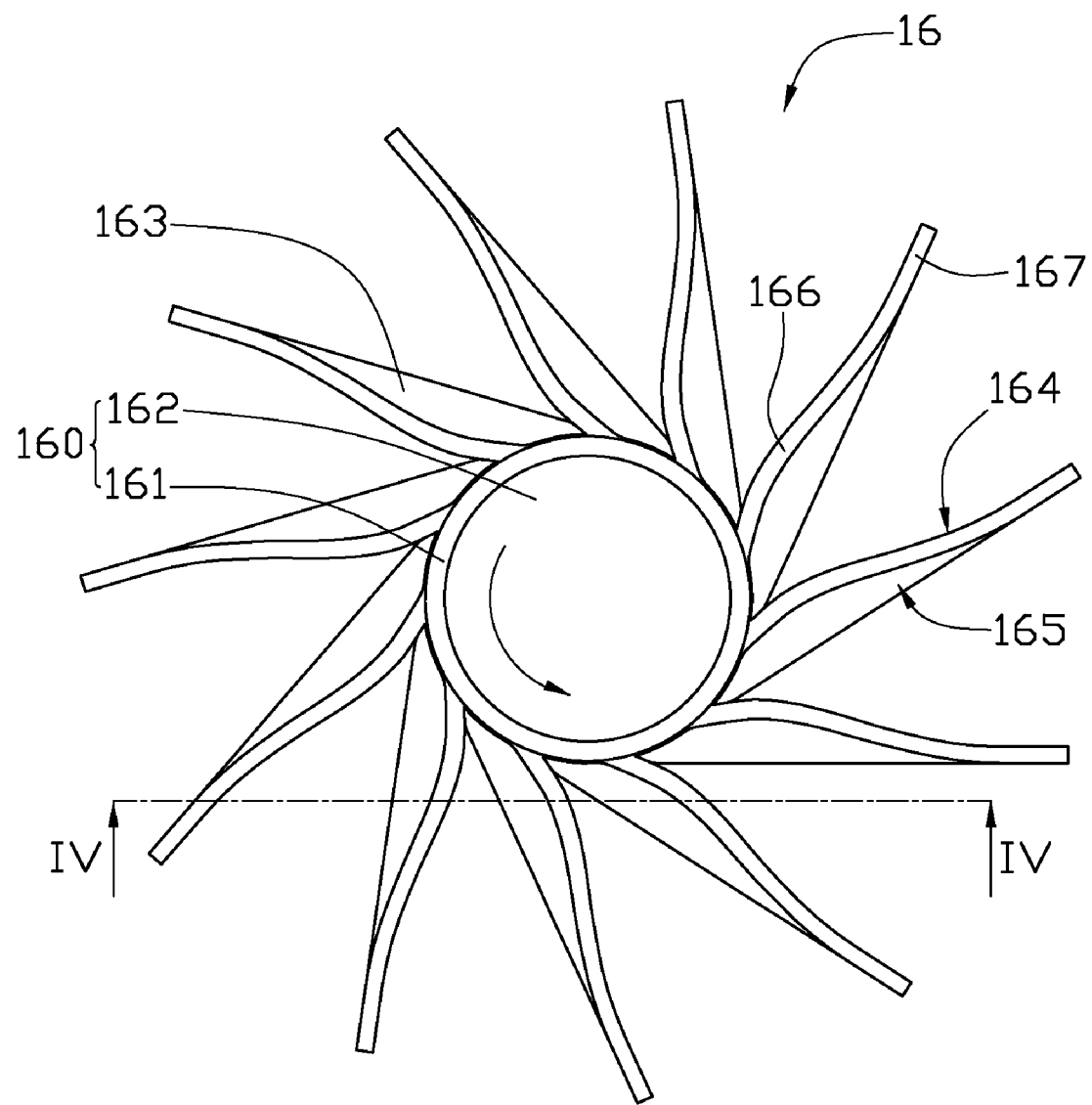
FIG. 3 is a plan view of an impeller of a centrifugal fan of the thermal module of FIG. 2.
Figure 4:
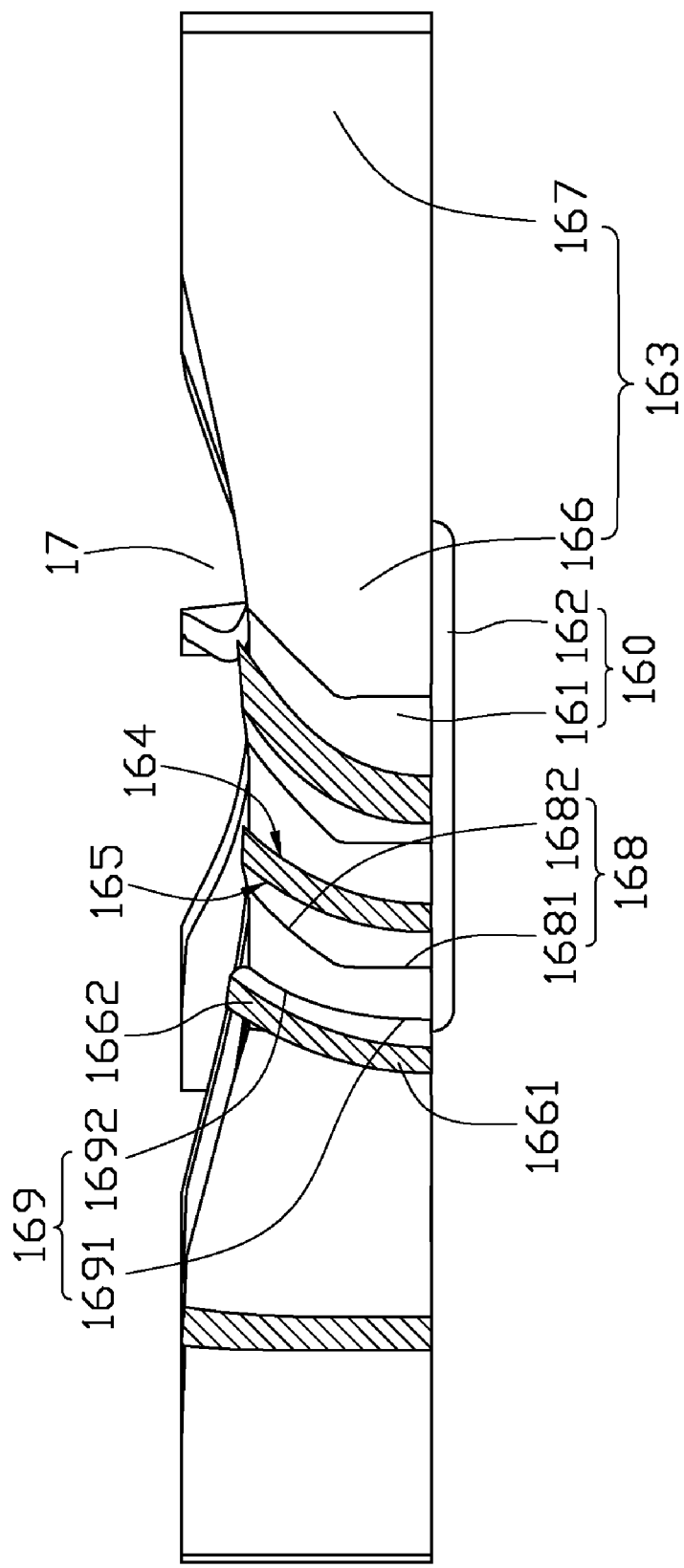
FIG. 4 is a cross sectional view of the impeller of FIG. 3, taken along line IV-IV thereof.

Referring also to FIGS. 3-4, the impeller 16 includes a hub 160 and a plurality of blades 163 extending outwardly from the hub 160. The hub 160 includes a circular plate 162 and a cylindrical sidewall 161 extending perpendicularly upwardly from an outer periphery of the circular plate 162 towards the top plate 12 of the housing 11. The blades 163 extend outwardly from an outer circumferential surface of the sidewall 161.

Each of the blades 163 includes an inner blade section 166 connected with the sidewall 161 of the hub 160 and an outer blade section 167 extending outwardly from the inner blade section 166. In the embodiment, the impeller 16 rotates counter-clockwise, as viewed from FIG. 3. Each of the blades 163 has a windward surface 164 and a leeward surface 165 opposite to the windward surface 164. A lower portion 1661 of the inner blade section 166 is curved upwardly and forwardly from a bottom of the blade 163 with a first curvature, while an upper portion 1662 of the inner blade section 166 is curved upwardly and forwardly from the lower portion 1661 with a second curvature which is larger than the first curvature. A concave is thus formed at the windward surface 164 and a convex is thus formed at the leeward surface 165 of the blade 163. The windward surface 164 connects with the sidewall 161 of the hub 160 at a line 169 including a lower curved segment 1691 corresponding to the lower portion 1661 of the inner blade section 166 and an upper curved segment 1692 corresponding to the upper portion 1662 of the inner blade section 166 of the blade 163. The lower curved segment 1691 has a curvature smaller than that of the upper curved segment 1692. The leeward surface 165 connects with the sidewall 161 of the hub 160 at an intersecting line 168 which includes a lower linear segment 1681 corresponding to the lower portion 1661 of the inner blade section 166 and an upper curve segment 1682 corresponding to the upper portion 1662 of the inner blade section 166, wherein the upper curve segment 1682 is curved upwardly and forwardly from the lower linear segment 1681 towards an adjacent front blade 163. The inner blade section 166 has a height smaller than the outer blade section 167, with a recess 17 defined above the inner blade sections 166 of the blades 163 around the sidewall 161 of the hub 160. The outer blade section 167 of each blade 163 is flat in the axial direction of the impeller 16, and disposed perpendicularly to the top plate 12 and the bottom plate 14 of the housing 11.

In assembly, the first fin assembly 80 and the second fin assembly 90 are respectively mounted at the first air outlet 18 and the second air outlet 19. A heat pipe (not shown) is provided to thermally connect the CPU with the fin assemblies 80, 90. In operation, the heat pipe absorbs heat from the CPU and transfers the heat to the fin assemblies 80, 90. The impeller 16 of the centrifugal fan 10 rotates and the blades 163 drive ambient air into the housing 11 via the air inlet 122, and then the ambient air is blown laterally towards the fin assemblies 80, 90 via the air outlets 18, 19 to take the heat away from the fin assemblies 80, 90. Since the upper portion 1662 of the inner blade section 166 of each blade 163 is curved upwardly and forwardly from the lower portion 1661 towards the adjacent front blade 163 with a larger curvature, the ambient air can be more easily drawn into the housing 11 under the guide and action of the inner blade sections 166 of the blades 163. The ambient air in the housing 11 is then thrown outwards by the lower portion 1661 of the inner blade section 166 and the flat outer blade section 167 towards the fin assemblies 80, 90. Thus, the centrifugal fan 10 can generate an airflow having a satisfactory air volume and air pressure, so that the efficiency of the centrifugal fan 10 is improved.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thermal module, comprising:
   a housing defining an air inlet in a top plate thereof and an air outlet in a sidewall thereof, the air inlet being perpendicular to the air outlet; and
   an impeller being rotatably received in the housing, the impeller comprising a hub and a plurality of blades extending outwardly from a sidewall of the hub, each of the blades comprising an inner blade section connected with the sidewall of the hub and an outer blade section extending outwardly from the inner blade section, the inner blade section comprising an upper portion oriented toward the air inlet of the top plate and a lower portion away from the air inlet of the top plate, the upper portion of the inner blade section being curved upwardly and forwardly from the lower portion of the inner blade section towards an adjacent front blade, wherein the lower portion of the inner blade section has a curvature smaller than that of the upper portion of the inner blade section of the each blade, the outer blade section of each blade being flat and disposed perpendicularly to the top plate of the housing;
   wherein each of the blades has a windward surface and a leeward surface opposite to the windward surface, the windward surface at the inner blade section forms as a concave surface, and the leeward surface at the inner blade section forms as a convex surface;
   wherein the windward surface connects with the sidewall of the hub at a line with an upper curved segment adjacent to the air inlet of the top plate and a lower curved segment away from the air inlet of the top plate, the lower curved segment has a curvature smaller than that of the upper curved segment; and
   wherein the leeward surface connects with the sidewall of the hub at an intersecting line which includes a lower linear segment corresponding to the lower portion of the inner blade section and an upper curve segment corresponding to the upper portion of the inner blade section, the lower linear segment extends along an axial direction of the impeller, and the upper curve segment of the intersecting line is curved upwardly and forwardly from the lower linear segment towards the adjacent front blade.

2. The thermal module of claim 1, wherein the inner blade section has a height smaller than the outer blade section, with a recess defined above the inner blade sections of the blades around the sidewall of the hub.

3. A thermal module, comprising:
   a fin assembly;
   a housing defining an air inlet in a top plate thereof and an air outlet in a sidewall thereof, the air inlet being perpendicular to the air outlet, the fin assembly being mounted at the air outlet, a bottom of the housing being completely closed by a bottom plate of the housing; and
   an impeller being rotatably received in the housing, the impeller comprising a hub and a plurality of blades extending outwardly from a sidewall of the hub, each of the blades comprising an inner blade section connected with the sidewall of the hub and an outer blade section extending outwardly from the inner blade section, the inner blade section comprising an upper portion oriented toward the air inlet of the housing and a lower portion away from the air inlet, the upper portion of the inner blade section being curved upward and forwardly from the lower portion of the inner blade section towards an adjacent front blade, the lower portion of the inner blade section having a curvature smaller than that of the upper portion of the inner blade section of the each blade, the outer blade section of each blade being flat and disposed perpendicularly to the top plate of the housing;
   wherein each of the blades has a windward surface and a leeward surface opposite to the windward surface, the windward surface at the inner blade section forms as a concave surface, and the leeward surface at the inner blade section forms as a convex surface;
   wherein the windward surface connects with the sidewall of the hub at a curve line having an increasing curvature along a direction from the bottom plate to the top plate, the leeward surface connects with the sidewall of the hub at an intersecting line which includes a lower linear segment corresponding to the lower portion of the inner blade section and an upper curve segment corresponding to the upper portion of the inner blade section, the lower linear segment is adjacent to the bottom plate and extends along an axial direction of the impeller, the upper curve segment is adjacent to the air inlet of the top plate, and the upper curve segment is curved upwardly and forwardly towards the adjacent front blade.

4. The thermal module of claim 3, wherein the inner blade section has a height smaller than the outer blade section, with a recess defined above the inner blade sections of the blades around the sidewall of the hub.

* * * * *